United States Patent [19]

Montgomery et al.

[11] Patent Number: 5,400,351
[45] Date of Patent: Mar. 21, 1995

[54] CONTROL OF A PUMPING DIODE LASER

[75] Inventors: John W. S. Montgomery, Stittsville; Ian J. Miller; Philip D. Barton, both of Ottawa; Robert G. Parker, Nepean, all of Canada

[73] Assignee: Lumonics Inc., Kanata, Canada

[21] Appl. No.: 239,975

[22] Filed: May 9, 1994

[51] Int. Cl.⁶ .................................................. H01S 3/04
[52] U.S. Cl. ........................................ 372/34; 372/25
[58] Field of Search .................................... 372/34–36, 372/25

[56] References Cited

U.S. PATENT DOCUMENTS

| | | | |
|---|---|---|---|
| 5,101,412 | 3/1992 | Pillsbury et al. | 372/34 |
| 5,103,453 | 4/1992 | Kebabian et al. | 372/38 |
| 5,195,102 | 3/1993 | McLean et al. | 372/34 |
| 5,212,699 | 5/1993 | Masuko et al. | 372/34 |
| 5,309,458 | 5/1994 | Carl | 372/34 |

*Primary Examiner*—Leon Scott, Jr.

[57] ABSTRACT

To maintain substantially constant the temperature of a diode junction of a pulsed, cooled, diode laser and hence the wavelength of the optical output of the laser, which laser is used for optically pumping a main, pulsed, solid state laser, the diode junction is heated by an external source during inactive intervals between pulses of the diode laser. This heating, which preferably is achieved by passing a heating current through the diode junction, is adjusted to ensure that, per a unit time greater than the length of an inactive interval, the heat energy received by the diode junction from this external heating together with the heat energy generated in the diode junction itself by the pulses is substantially constant independent of the length of the inactive intervals. Preferably the heating current has a constant level except for a period after each pulse when the level is reduced, e.g. to zero. To achieve the constant total heating of the diode junction, this period has a length such that the heat energy denied to the diode junction during this period is substantially equal to the heat energy generated in the diode junction during a pulse. The arrangement permits variation of the pulse repetition rate of the main laser at will without adverse effect on its pumping by the diode laser.

18 Claims, 3 Drawing Sheets

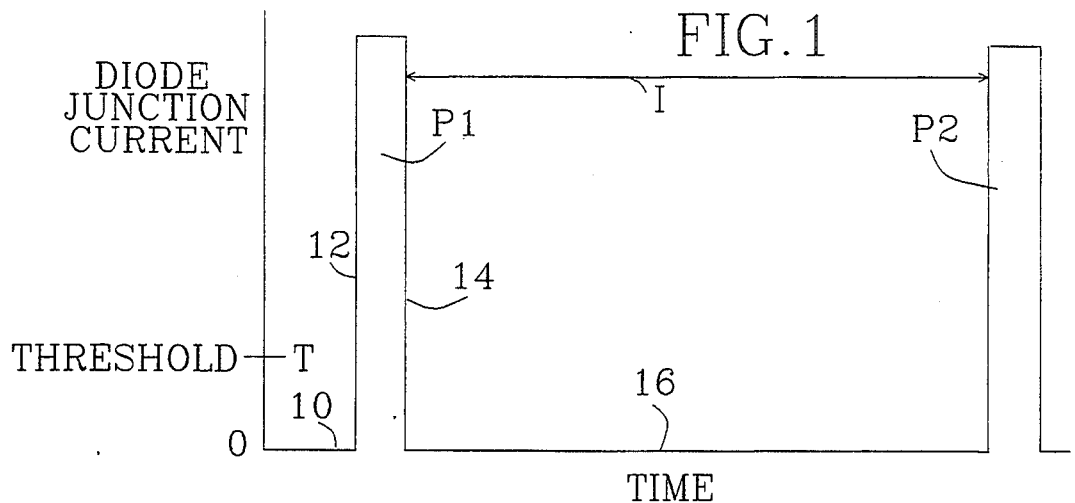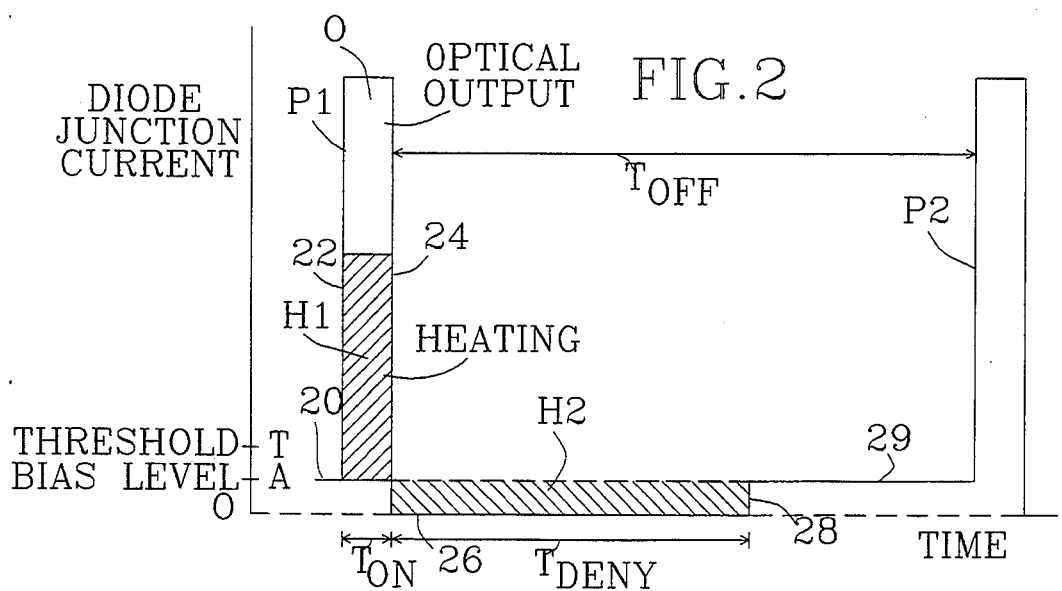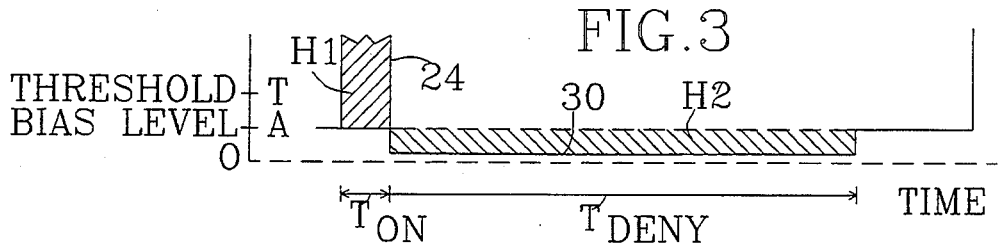

CONTROL OF A PUMPING DIODE LASER

FIELD OF THE INVENTION

The invention relates to a control system and method for a diode laser that is used to pump a larger, pulsed, solid state laser (hereinafter the "main" laser). Typically, the main laser might have a pulse repetition rate of 1 KHz and have sufficient power to be usable for materials processing, e.g. marking, ablating, cutting or otherwise working a workpiece.

BACKGROUND OF THE INVENTION

It is conventional practice to employ one or more diode lasers to optically pump the main laser, e.g. an Nd:YAG laser. This pumping takes the form of an optical pulse of a wavelength that falls within a strong absorption portion of the spectrum of the material in the main laser that is to be pumped preparatory to each firing of such laser. In order for the pumping effect to be optimum this wavelength alignment between the optical pumping pulse and the absorption spectrum of the material in the main laser must be maintained within a comparatively narrow tolerance. However, the wavelength of the optical pumping pulse is relatively sensitive to the temperature of the diode junction in the pumping laser. The formation of a series of optical pulses in the diode laser generates a significant amount of heat in the diode junction. Typically only about 40% of the energy of each firing of the diode laser appears as an optical output, the remainder becoming heat in the diode junction. The diode laser is provided with a cooling system, so that it is possible by suitable adjustment of this system to cause the diode junction to achieve and retain a substantially constant equilibrium temperature, and hence to produce a constant wavelength of its optical output.

This equilibrium is, however, only maintained if the common pulse repetition rate of the two lasers remains unchanged so that the amount of heat generated per second in the diode junction remains unchanged. This consideration has represented a major disadvantage of prior systems of this type. The user must either use the main laser at a constant repetition rate, in order to keep the repetition rate of the diode laser also constant, or, if he wants to vary this rate, he must readjust the cooling system of the diode laser to regain the required equilibrium temperature of the diode junction. Such a readjustment requires skill and time.

SUMMARY OF THE INVENTION

It is a primary objective of the present invention to provide a way of avoiding this problem by so controlling the diode laser that the temperature of the diode junction is maintained substantially constant independent of the pulse repetition rate of the two lasers. This result provides the user of the main laser with the freedom to vary its repetition rate instantaneously and at will, e.g. to suit the needs of the work that the laser is performing, including, if desired, putting the laser on standby, without readjustment of the cooling system being necessary.

For example, in a diode laser designed for a 20% duty cycle for pumping a main laser operating at a pulse repetition rate of 1 KHz, each optical pulse from the diode laser would typically last for about 200 $\mu s$, with the inactive intervals between pulses each being 800 $\mu s$. If the pulse repetition rate were halved to 500 Hz, for example, these inactive intervals would each be increased to about 1800 $\mu s$.

In the conventional manner of operating such a pumping diode laser there is no current through the diode junction during these inactive intervals. Current is applied only when it is desired to cause the diode laser to lase and produce an optical pulse.

In one aspect of the present invention the above described objective can be achieved by passing a bias current through the diode junction of the diode laser at a relatively low level during the inactive intervals in order to heat the diode junction resistively and hence compensate for any change in the heating of the diode junction due to a reduction in the repetition rate. This heating current is preferably at a level below the lasing threshold level of the diode laser, but, as will appear from the description below, it can be above such threshold level.

In order to achieve a rate of heating of the diode junction to balance the controlled cooling effect of the cooling system, the value of the externally applied diode junction heating current applied during the inactive intervals must take into account the heat generated during pulsing, i.e. the approximately 60% of the electrical energy that is not converted to light in the diode laser. Hence, for a unit time greater than the length of an inactive interval, the amount of extra heat energy to be applied to the diode junction by the externally applied heating current during the inactive intervals needs to be equal to a fixed amount minus the total amount of heat energy that the diode junction receives as a result of the number of optical pulses it emits during such unit time. If the pulse energy is high, this subtracted amount of energy will be larger than when the pulse energy is low.

This solution to the problem can be defined as a method of maintaining substantially constant the temperature of the diode junction of a pulsed, cooled, diode laser used for optically pumping a main, pulsed, solid state laser, comprising heating the diode junction during inactive intervals between pulses of the diode laser by passing a current through the diode junction, and so adjusting the value of this heating current that, per a unit time greater than the length of a said inactive interval, the heat energy received by the diode junction from the heating current together with the heat energy generated in the diode junction during pulsing is substantially constant independent of the length of said inactive intervals.

The preferred practical method for achieving this result is to maintain the applied heating current at a basic constant bias level, except for reducing this level temporarily for a period after each pulse. The length of this reduction period is so chosen that the heating energy denied the diode junction during this reduction period is equal to the heat energy it has just received from the pulse. At the end of this reduction or denial period the applied heating current is returned to its basic level.

This reduction in the heating current level preferably takes the form of a reduction to zero, since such procedure keeps the period of the reduction to a minimum. However, if the inactive intervals between pulses are long enough, the reduction need not be to zero and can be to a fraction of the basic level, in which case there is only a partial denial of the externally applied heating to the diode junction. In this case, the reduction or partial denial period after each pulse will need to be lengthened appropriately, since the amount of heating current denied the diode junction per unit time has been reduced.

Another way in which a similar effect can be achieved is to monitor the pulse repetition rate and modify the level of the externally applied heating current to take into account a subtraction factor determined by the amount of heat energy the diode junction receives per pulse, multiplied by the number of pulses per unit time. This applied heating current would have a constant level, i.e. not being reduced for temporary periods after each pulse, but only so long as the repetition rate stayed unchanged. If the repetition rate were changed, for example reduced, the subtraction factor would also have to be reduced so that the level of the applied heating current would be raised to a new level that would then remain constant until there was another change to the repetition rate.

Up to this point it has been assumed that the heating effect has been obtained by passing a current directly through the diode junction of the diode laser, and this method is indeed by far preferred. However, it is possible to heat the diode junction indirectly, as by conduction from a separate heater located adjacent the diode junction, or by radiation, e.g. from a further laser. Thus the invention, in its broad scope, can be defined as heating the diode junction (by whatever means) in accordance with one of the time regimes discussed above.

It should be noted that it is not new to apply heat to a diode laser. For example, Kebabian et al. U.S. Pat. No. 5,103,453 issued Apr. 7, 1992 discloses a system in which a diode laser is heated by radiation from another laser to change the frequency of the output of the diode laser. It is also known to heat a diode laser resistively by passing a current through it. The essence of the present invention is hence not the heating per se of the diode junction of a diode laser, but rather the application of heat to the diode junction in a particular sequence that is related to the pulse repetition rate and other parameters in such a way as to maintain substantially constant the combined heating effects of the externally applied heat and the heat generated by the pulsing of the laser.

The invention also comprises a system for controlling the diode laser in accordance with one of the sequences explained above.

Since with age the diode junction can be expected to experience some increase of its heat dissipation during lasing of the diode laser, a calibration loop having an input sensitive to the output of the diode laser can be provided that will apply another modifying factor to the level of the applied heating current to compensate for the aging of the diode junction.

Yet another feature of the system provides for modification of the length of the optical pulses from the diode laser depending on the output power of the main laser. If monitoring shows that the output power of the main laser has deteriorated, the length (in time) of each of the optical pulses from the diode laser can be increased in order to increase their pumping effect on the main laser in an endeavour to restore its output power.

While a single diode laser has been used in this description to explain the inventive features, it will be understood that in many practical applications the main laser will be pumped by a plurality of diode lasers. In this case, the control of all the diode lasers will normally be modified in the same way.

BRIEF DESCRIPTION OF THE DRAWINGS

FIG. 1 is a pulse diagram illustrating the conventional performance of a diode laser for pumping a main laser;

FIG. 2 is a similar pulse diagram illustrating one manner of modifying the performance of the diode laser in accordance with the preferred embodiment of the present invention;

FIGS. 3 and 4 each illustrate an alternative to the procedure of FIG. 2;

DETAILED DESCRIPTION OF THE PREFERRED EMBODIMENTS

Figure 4:
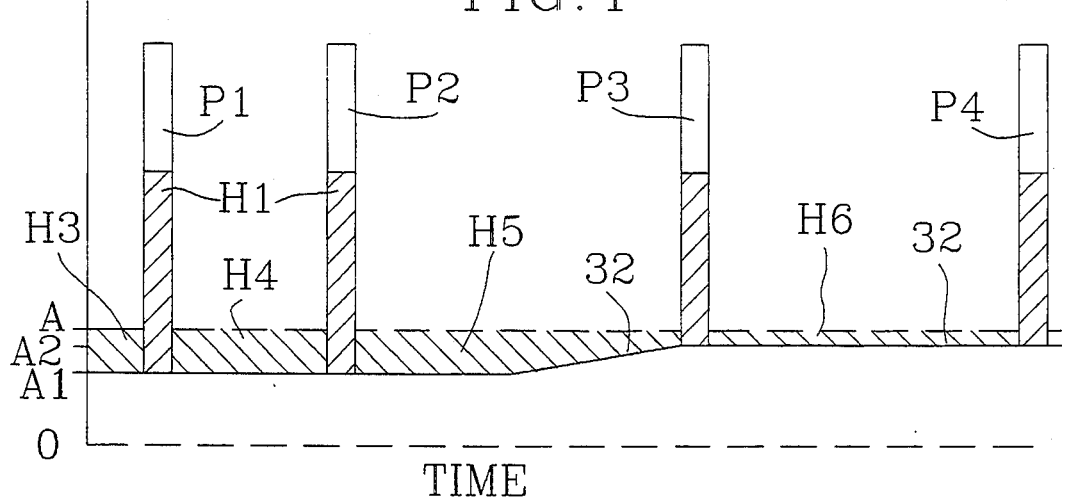

FIG. 1 shows the current in the diode junction of a diode laser under conventional operation. Starting from a zero level at 10 the current rises sharply at 12 to exceed the threshold T for lasing, to produce a pulse P1. At the conclusion of this pulse the current drops again at 14 to zero at 16. This sequence is repeated for a second pulse P2 after an inactive interval I, and so on. In practice, of course, the pulses will not be as regularly rectangular as they have been shown in the drawings for convenience, and no attempt has been made to draw the diagrams to scale.

FIG. 2, which illustrates the preferred embodiment of the present invention, shows a heating current 20 at an initial or so-called bias level A (below the threshold level T) that is passed through the diode junction. For lasing this current rises at 22 to form the pulse P1 as in the conventional system of FIG. 1, and, at the end of the pulse P1, i.e. after an active time $T_{on}$, falls at 24 to zero at 26. The zero value 26 remains until after a reduction or deny period $T_{deny}$ that is less than the inactive interval which is here referred to as $T_{off}$, whereupon the current rises again at 28 to reassume the basic level A at 29. The same sequence is repeated after the second pulse P2 and subsequently.

In the pulse P1 the area 0 represents the fractional electrical energy that is converted to optical energy and the hatched area H1 represents the fractional electrical energy that is converted to heat in the diode junction. The length of the period $T_{deny}$ is so chosen that a second hatched area H2, which represents the heat energy denied to the diode junction by virtue of the current being zero instead of having the value A for this period, is substantially equal to the area H1, i.e. the extra heat energy that the diode junction receives during the pulse P1. It will be seen that, provided that the off time $T_{off}$ is short compared with the thermal response time of the diode junction and provided that the cooling remains constant, the system will maintain a substantially constant diode junction temperature within the acceptable tolerance, regardless of the repetition rate of the diode laser.

It should be noted that the resistance of the diode junction falls with increased current through it. As a result, the voltage across the diode junction is substantially constant, and therefore the diode junction current is substantially proportional to the power dissipated in the diode junction.

FIG. 3 shows a variant of FIG. 2, wherein after the pulse P1 the current 24 is not reduced to zero but to a level 30 equal to a fraction of A, say 25% of A, for a period (still referred to as $T_{deny}$ although it is only a partial denial) that is longer than the period $T_{deny}$ of FIG. 2. The equality between the areas H1 and H2' can thus be retained.

FIG. 4 shows a further variant in which the heating current level is set at a constant value A1, except during a pulse P1 when it is increased to cause lasing. The value of A1 is calculated from the monitored repetition rate of the diode laser, so that the heating effect denied the diode junction between pulses (shown as areas H3, H4, H5, H6 etc.) over a unit time longer than the length of the inactive intervals equals the extra heat represented by the areas H1. If the repetition rate is reduced, as shown by the pulses P3 and P4, the value of the otherwise constant heating current rises at 32 to a new level A2 to maintain this equality, since the length of a typical area H6 at the reduced repetition rate will now be longer than that of a typical area H4 at the faster repetition rate. In other words, the area H6 will equal the area H4. The applied heating current will remain constant at this new level A2 until the repetition rate is again changed.

Figure 5A:
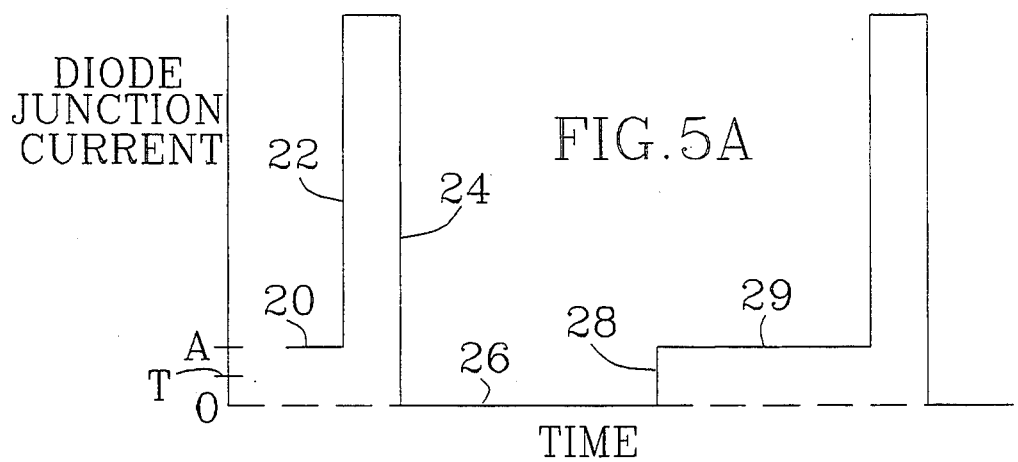
FIGS. 5A, 5B and 5C together illustrate another alternative.
Figure 5B:
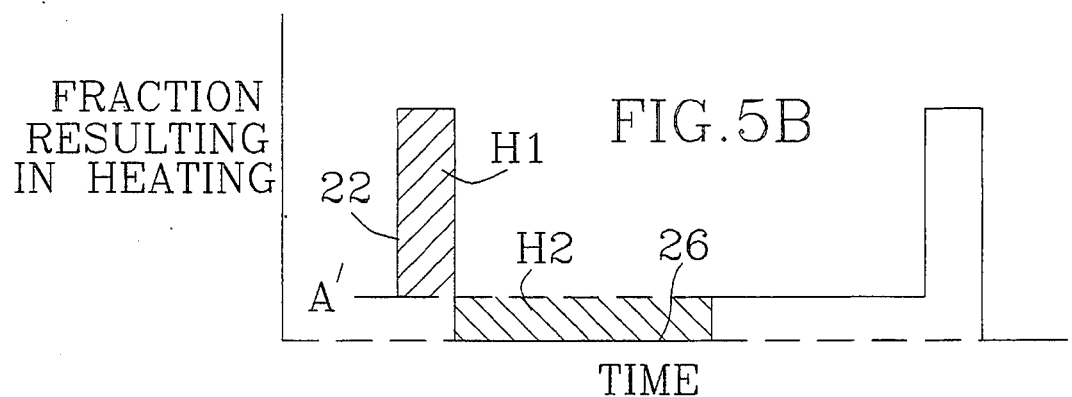
Figure 5C:
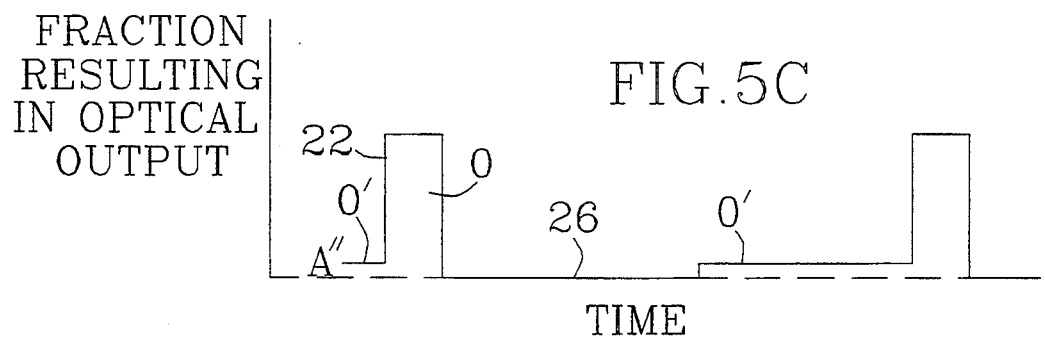

FIGS. 5A, 5B and 5C illustrate an embodiment in which the level A is higher than the threshold current T. Although a value of A below T is normally preferred, since it avoids energy storage in the main laser between pulses and tends to favour a longer lifetime for the diode laser, FIGS. 5A, 5B and 5C illustrate the more general case in which the value of A is not restricted by the threshold level T.

FIG. 5A shows the diode junction current sequence 20, 22, 24, 26, 28 and 29, the same as in FIG. 2. FIG. 5B shows the fraction A' of this current that results in heating of the diode junction. As before, the area H1 represents the heating effect on the diode junction during a pulse, and the area H2 represents the heating subsequently denied the diode junction when the current temporarily drops to zero at 26 for the denial period. As before H1=H2. FIG. 5C shows the fraction A" (A=A'+A") of the current that results first in a relatively low level optical output 0' and subsequently the main optical output 0 when the current A climbs at 22. There is no optical output when the current falls to zero at 26 for the denial period.

As discussed above, the diode junction may be heated indirectly. In this case, the direct diode junction current will follow the conventional format of FIG. 1 in order to pulse the diode laser, while the current through the adjacent heater, or the applied radiation, or the energisation by whatever means is used to heat the diode junction, will follow the sequence of FIG. 2, i.e. dropping to zero for a deny time following each pulse, or alternatively will follow one of the time sequences of FIG. 3, 4, or 5A–C.

Figure 6:
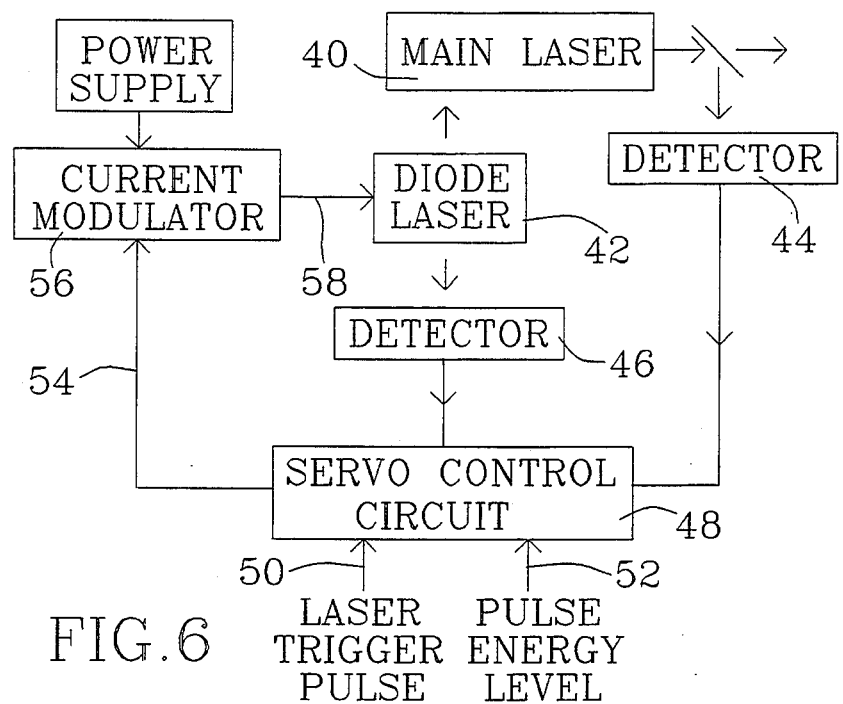
FIG. 6 shows a block diagram of a control system.

FIG. 6 shows a control system. A main laser 40 is pumped by at least one diode laser 42 in the conventional manner. A photo detector 44 measures the pulse output of the main laser 40, and a second photo detector 46 measures the pulse output of the diode laser 42. In addition to receiving the outputs of these detectors, a servo control circuit 48 receives instructions from the operator in the form of a conventional laser trigger pulse 50 and a conventional signal 52 that represents the pulse energy level desired from the main laser 40, a level that is controlled by the length of the pulses P1 etc., i.e. the time $T_{on}$.

The control circuit 48 is programmed to send a sequence command 54 to a current modulator 56 that feeds a current 58 to the diode laser 42. The sequence command 54 contains instructions for triggering and heating the diode laser, i.e. for causing the current 58 to follow the sequence of values 20, 22, 24, 26, 28, 29 (assuming operation in accordance with the sequence of FIG. 2); for regulating the maximum value of the current 58 (the height of the pulses P1, P2 etc. and hence the energy levels of the two lasers); and for setting the times $T_{on}$ and $T_{deny}$. If one of the other embodiments of FIGS. 3, 4 or 5A–5C is adopted, the command program in the control circuit 48 is modified correspondingly. The operator may also adjust the cooling of the diode laser to achieve the desired wavelength of its optical output.

If the detector 44 detects a reduction in the output of the main laser 40, it causes the control circuit 48 to increase the pulse length, namely the time $T_{on}$, until this output is restored to its desired value. This change to $T_{on}$ will require a corresponding increase in the time $T_{deny}$ in order to maintain the relationship H1=H2.

If the detector 46 detects a reduction in the output of the diode laser 42, it causes the control circuit to increase the maximum value of the current 58, i.e. the height of the pulses P1, P2 etc. until this output is restored. This change will require a corresponding change (increase) in the value of A at which the current 58 operates.

We claim:

1. A method of maintaining substantially constant the temperature of a diode junction of a pulsed, cooled, diode laser for optically pumping a main, pulsed, solid state laser, comprising heating said diode junction during inactive intervals between pulses of the diode laser and so adjusting said heating that, per a unit time greater than the length of a said inactive interval, heat energy received by the diode junction from said heating together with heat energy generated in the diode junction by said pulses is substantially constant, independent of the length of said inactive intervals.

2. A method according to claim 1, wherein said heating of the diode junction is achieved by passing a heating current through the diode junction.

3. A method of maintaining substantially constant the temperature of a diode junction of a pulsed, cooled, diode laser for optically pumping a main, pulsed, solid state laser, comprising heating said diode junction during inactive intervals between pulses of the diode laser by passing a heating current through said diode junction and adjusting said heating current to have a constant level except for a period after each pulse when said current is reduced, said period having a length such that the heat energy denied to the diode junction during such period is substantially equal to the heat energy generated in the diode junction during a pulse.

4. A method according to claim 3, wherein the heating current is reduced to zero during said period.

5. A method according to claim 3, wherein the heating current is reduced to a fraction of said constant level during said period.

6. A method according to claim 3, wherein said constant level is below a threshold level for causing the diode laser to lase.

7. A method according to claim 3, wherein said constant level is at least as great as a threshold level for causing the diode laser to lase.

8. A method according to claim 3, including detecting the output of the main laser and modifying the length of said pulses of the diode laser to modify said output.

9. A method according to claim 3, including detecting the output of the diode laser and modifying the height of said pulses of the diode laser to modify said output.

10. A control system for maintaining substantially constant the temperature of a diode junction of a pulsed, cooled, diode laser for optically pumping a main, pulsed, solid state laser, comprising means for heating said diode junction and means for controlling said heating means in accordance with a time sequence of heating values such that, per a unit time greater than the length of each inactive interval between pulses of the diode laser, heat energy received from said heating means together with heat energy generated in the diode junction by said pulses is substantially constant, independent of the length of said inactive intervals.

11. A system according to claim 10, wherein said heating means comprise means for passing a heating current through the diode junction.

12. A system according to claim 11, wherein said means for controlling the heating means controls such heating means to pass the heating current through the diode junction at a constant level except for a period after each pulse when said current is reduced, said period having a length such that the heat energy denied to the diode junction during such period is substantially equal to the heat energy generated in the diode junction during a pulse.

13. A system according to claim 12, wherein the heating current is reduced to zero during said period.

14. A system according to claim 12, wherein the heating current is reduced to a fraction of said constant level during said period.

15. A system according to claim 12, wherein said constant level is below a threshold level for causing the diode laser to lase.

16. A system according to claim 12, wherein said constant level is at least as great as a threshold level for causing the diode laser to lase.

17. A system according to claim 12, including means for detecting the output of the main laser and for modifying the length of said pulses of the diode laser to modify said output.

18. A system according to claim 12, including means for detecting the output of the diode laser and modifying the height of said pulses of the diode laser to modify said output.

* * * * *